(12) United States Patent
Yee

(10) Patent No.: US 11,839,137 B2
(45) Date of Patent: Dec. 5, 2023

(54) DISPLAY APPARATUS AND METHOD OF MANUFACTURING THE SAME

(71) Applicant: Samsung Display Co., Ltd., Yongin-si (KR)

(72) Inventor: Dong-Su Yee, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 392 days.

(21) Appl. No.: 17/017,584

(22) Filed: Sep. 10, 2020

(65) Prior Publication Data

US 2021/0104694 A1 Apr. 8, 2021

(30) Foreign Application Priority Data

Oct. 8, 2019 (KR) .......................... 10-2019-0124678

(51) Int. Cl.
*H10K 77/10* (2023.01)
*B32B 3/02* (2006.01)
(Continued)

(52) U.S. Cl.
CPC .............. *H10K 77/111* (2023.02); *B32B 3/02* (2013.01); *B32B 3/10* (2013.01); *B32B 5/18* (2013.01);
(Continued)

(58) Field of Classification Search
CPC ......... B32B 3/02; B32B 3/10; B32B 2457/20; B32B 5/18; B32B 7/12; B32B 15/08; B32B 15/18; B32B 27/065; B32B 37/02; B32B 2266/0228; B32B 2266/0278; H10K 77/111; H10K 50/844; H10K 59/12;
(Continued)

(56) References Cited

U.S. PATENT DOCUMENTS 9,119,316 B2 8/2015 Lee
2008/0026306 A1* 1/2008 Lamansky ............. B41M 7/009
430/31
(Continued)

FOREIGN PATENT DOCUMENTS

KR 1020160144912 12/2016
KR 10-2018-0079096 7/2018
KR 101911047 10/2018

OTHER PUBLICATIONS

JP4147298 B2 (Sato Akihiro et al. ) (filed 2005) (Year: 2005).*
(Continued)

*Primary Examiner* — Kyoung Lee
*Assistant Examiner* — Christina A Sylvia
(74) *Attorney, Agent, or Firm* — H.C. Park & Associates, PLC

(57) ABSTRACT

A display apparatus including a first non-folding area, a second non-folding area spaced apart from the first non-folding area, and a folding area between the first non-folding area and the second non-folding area, a flexible display panel, a metal plate supporting the flexible display panel and including a recess in the folding area, the metal plate having a first thickness in the first non-folding area and the second non-folding area, and a second thickness less than the first thickness in the folding area, a resin portion disposed in the recess, and a first adhesive layer disposed between the flexible display panel and the metal plate.

20 Claims, 9 Drawing Sheets

(51) Int. Cl.
- *B32B 3/10* (2006.01)
- *B32B 5/18* (2006.01)
- *B32B 7/12* (2006.01)
- *B32B 15/08* (2006.01)
- *B32B 15/18* (2006.01)
- *B32B 27/06* (2006.01)
- *B32B 37/02* (2006.01)
- *H10K 50/844* (2023.01)
- *H10K 59/12* (2023.01)
- *H10K 71/00* (2023.01)
- *H10K 102/00* (2023.01)

(52) U.S. Cl.
CPC ............... *B32B 7/12* (2013.01); *B32B 15/08* (2013.01); *B32B 15/18* (2013.01); *B32B 27/065* (2013.01); *B32B 37/02* (2013.01); *H10K 50/844* (2023.02); *H10K 59/12* (2023.02); *H10K 71/00* (2023.02); *B32B 2266/0228* (2013.01); *B32B 2266/0278* (2013.01); *B32B 2457/20* (2013.01); *H10K 59/1201* (2023.02); *H10K 2102/311* (2023.02)

(58) Field of Classification Search
CPC ............... H10K 71/00; H10K 59/1201; H10K 2102/311; H10K 59/124; H10K 50/8426; G02F 1/133305; Y02E 10/549; Y02P 70/50; G06F 1/1652; G06F 1/1681; G06F 1/1616; G06F 2203/04102; G09F 9/301; G09F 9/33; H04M 1/0214
See application file for complete search history.

(56) References Cited

U.S. PATENT DOCUMENTS

| | | | |
|---|---|---|---|
| 2013/0216740 A1* | 8/2013 | Russell-Clarke | B23K 26/38 |
| | | | 219/121.72 |
| 2016/0357052 A1 | 12/2016 | Kim et al. | |
| 2016/0359132 A1* | 12/2016 | Sun | H10K 77/111 |
| 2018/0013080 A1 | 1/2018 | Kim et al. | |
| 2018/0033979 A1* | 2/2018 | Jang | B32B 27/08 |
| 2018/0108863 A1* | 4/2018 | Kajiyama | H01L 51/5253 |
| 2018/0190936 A1* | 7/2018 | Lee | B32B 25/20 |
| 2019/0204872 A1* | 7/2019 | Lee | G06F 1/1641 |
| 2020/0203642 A1* | 6/2020 | Kim | B32B 27/308 |

OTHER PUBLICATIONS

Translation of JP4147298 B2 (Sato Akihiro et al.) (Mar. 25, 2005). (Year: 2005).*

Extended European Search Report dated Feb. 9, 2021, issued to European Patent Application No. 20198262.6.

* cited by examiner

DISPLAY APPARATUS AND METHOD OF MANUFACTURING THE SAME

CROSS-REFERENCE TO RELATED APPLICATION

This application claims priority from and the benefit of Korean Patent Application No. 10-2019-0124678, filed on Oct. 8, 2019, which is incorporated by reference for all purposes as if fully set forth herein.

BACKGROUND

Field

Exemplary embodiments of the invention relate generally to a display apparatus and a method of manufacturing the same and, more specifically, to an in-folding type foldable display apparatus and a method of manufacturing the same.

Discussion of the Background

With the development of the technology, display products having smaller sizes, lighter weights, and superior performance have been manufactured. Conventional cathode ray tube (CRT) televisions have been widely used for display apparatuses due to its performance and price. Recently, however, a display apparatus such as a plasma display apparatus, a liquid crystal display apparatus, and an organic light emitting display apparatus, which provides various advantages over CRT devices, such as in terms of miniaturization, light weight, and low power consumption, has been spotlighted.

Recently, as bendable and flexible display apparatuses are developed, researches on applying the flexible display apparatus to a mobile device having a foldable structure have been conducted. For example, a foldable display apparatus that includes a folding area and is bendable has been developed. However, when the foldable display apparatus is completely folded (e.g., bent angularly) in the folding area, a display element itself may be damaged. Thus, there are demands for developing a support structure having durability while preventing damages by limiting the radius of curvature of the foldable display apparatus that is bent when the mobile device is folded. In particular, the quality of the foldable display apparatus may be deteriorated when a wrinkle or a fine concavo-convex portion in the display area is recognized by the user according to the configuration of the support structure.

The above information disclosed in this Background section is only for understanding of the background of the inventive concepts, and, therefore, it may contain information that does not constitute prior art.

SUMMARY

Foldable display apparatuses constructed according to exemplary embodiments of the invention and a manufacturing method of the same provide an improved quality.

Additional features of the inventive concepts will be set forth in the description which follows, and in part will be apparent from the description, or may be learned by practice of the inventive concepts.

A display apparatus including a first non-folding area, a second non-folding area spaced apart from the first non-folding area, and a folding area between the first non-folding area and the second non-folding area according to an exemplary embodiment includes a flexible display panel, a metal plate supporting the flexible display panel and including a recess in the folding area, the metal plate having a first thickness in the first non-folding area and the second non-folding area, and a second thickness less than the first thickness in the folding area, a resin portion disposed in the recess, and a first adhesive layer disposed between the flexible display panel and the metal plate.

The metal plate may further include opening patterns in the folding area.

The metal plate may include steel use stainless (SUS).

The first thickness of the metal plate may be about 100 μm or less.

The resin portion may include a base and protrusions protruding from the base and disposed inside the opening patterns, and the protrusions may be disposed between the base and the flexible display panel.

The resin portion may include a carbon component.

The resin portion may include graphite powder.

The resin portion may have a modulus lower than a modulus of the metal plate.

An air gap may be formed in the opening pattern of the metal plate.

The air gap may be defined by an upper surface of the protrusion of the resin portion and a lower surface of the first adhesive layer.

The first and second non-folding areas may be spaced apart in a first direction, and each of the opening patterns of the metal plate may extend in a second direction perpendicular to the first direction and disposed in a zigzag form in the first direction.

The opening pattern disposed at an edge of the metal plate in the second direction may have one side connected to the edge of the metal plate and is opened, when viewed in a plan view.

The flexible display panel may be configured to be positioned inward of the metal plate when the display apparatus is in a folded state due to bending of the folding area.

The display apparatus may further include a cushion layer disposed between the first adhesive layer and the flexible display panel, the cushion layer including a foam-shaped material, and a second adhesive layer disposed between the cushion layer and the flexible display panel.

The flexible display panel may includes a flexible substrate, a thin film transistor disposed on the flexible substrate, a first electrode electrically connected to the thin film transistor, a light emitting structure disposed on the first electrode, and a second electrode disposed on the light emitting structure.

The display apparatus may further include a thin film encapsulation layer disposed on the second electrode, a third adhesive layer disposed on the thin film encapsulation layer, and a window layer disposed on the third adhesive layer.

A method of manufacturing a display apparatus including a first non-folding area, a second non-folding area spaced apart from the first non-folding area, and a folding area between the first non-folding area and the second non-folding area according to another exemplary embodiment includes the steps of forming a recess on a metal plate in the folding area to have a first thickness in the first non-folding area and the second non-folding area, and a second thickness less than the first thickness in the folding area by the recess, forming a resin portion in the recess of the metal plate, attaching a cushion layer onto the metal plate by using a first adhesive layer, and attaching a display panel structure including a flexible display panel onto the cushion layer.

The step of forming the metal plate may include forming the recess by removing a portion of the metal plate in the folding area through an etching process, and forming opening patterns on the metal plate in the folding area through an etching process.

The steps may further include providing a resin solution in the recess and the opening patterns of the metal plate to form a resin portion including a base and protrusions protruding from the base and disposed inside the opening patterns.

The step of forming the resin portion may include providing a support portion having projections corresponding to the opening patterns under the metal plate before providing the resin solution, and forming the resin portion including the base and the protrusions by providing the resin solution, and when the cushion layer is attached onto the metal plate by using the first adhesive layer, an air gap defined by an upper surface of the protrusion of the resin portion and a lower surface of the first adhesive layer may be formed in the opening pattern.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
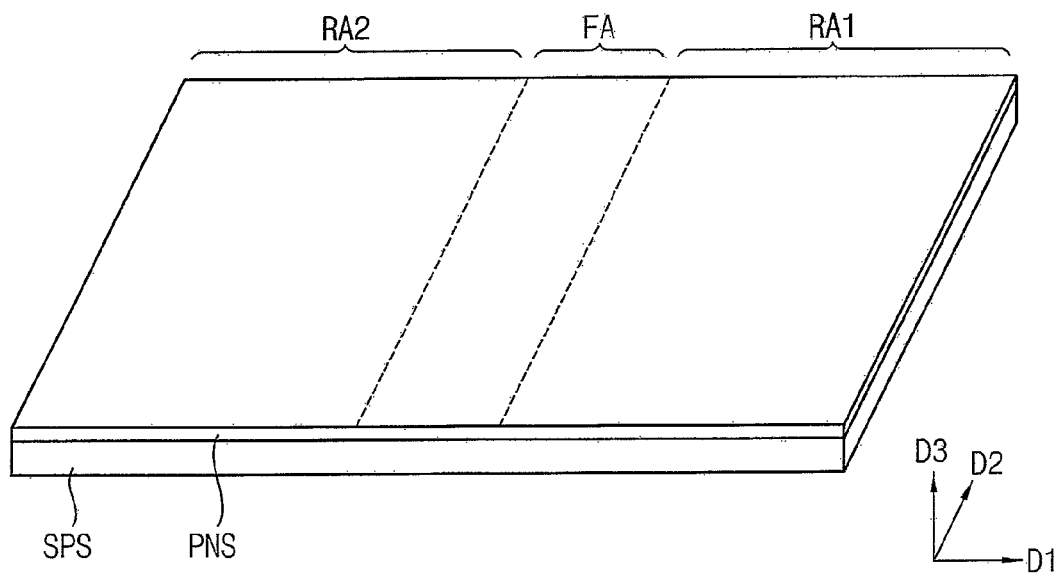
FIG. 1 is a perspective view of a display apparatus according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As is customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, exemplary embodiments will be described in detail with reference to the accompanying drawings.

Figure 2:
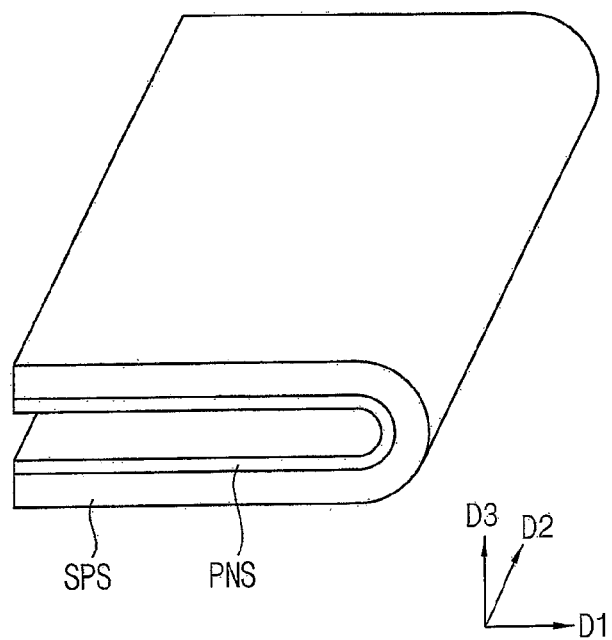
FIG. 2 is a perspective view illustrating a folded state of the display apparatus of FIG. 1.

FIG. 1 is a perspective view of a display apparatus according to an exemplary embodiment, and FIG. 2 is a perspective view illustrating a folded state of the display apparatus of FIG. 1.

Referring to FIGS. 1 and 2, the display apparatus may include a display panel structure PNS including a flexible display panel and a support structure SPS configured to support the display panel structure PNS.

The display apparatus may include a first non-folding area RA1, a second non-folding area RA2 spaced apart from the first non-folding area RA1 in a first direction D1, and a folding area FA disposed between the first non-folding area RA1 and the second non-folding area RA2.

The display panel structure PNS may include a display panel (see PN of FIG. 3) configured to display an image, and the image may be displayed on a front surface of the display apparatus. The front surface may include a display area and a non-display area surrounding the display area, and the display area may be formed through the first non-folding area RA1, the folding area FA, and the second non-folding area RA2.

The display apparatus may be bent to be folded and unfolded by the folding area FA, and an in-folding type foldable display apparatus may be implemented, such that the front surfaces configured to display images may face each other in the folded state.

Figure 3:
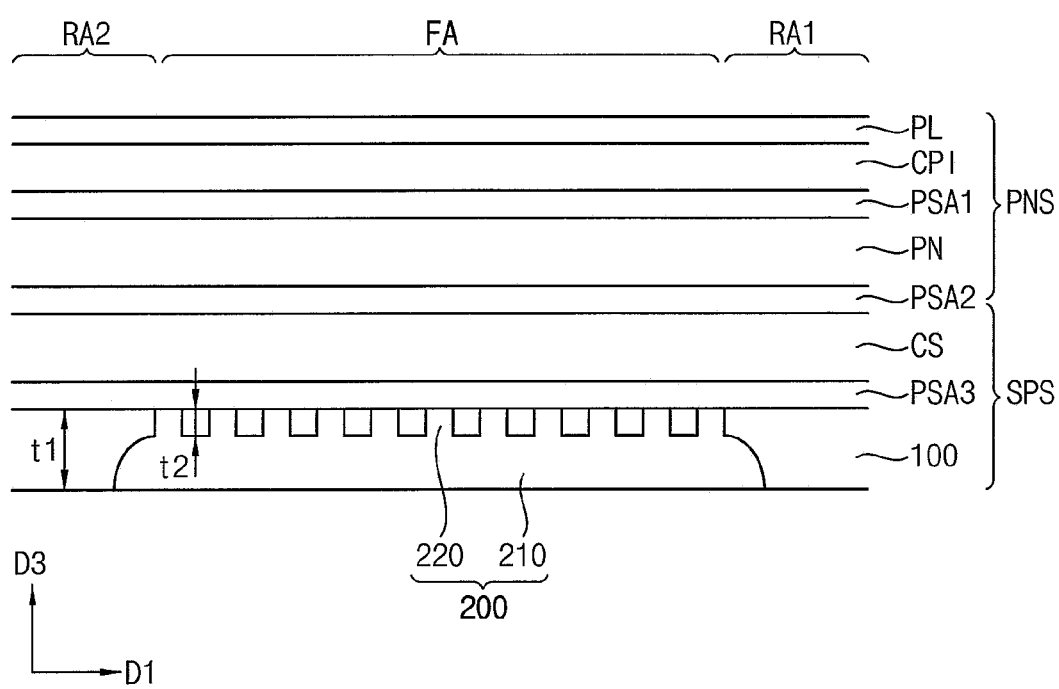
FIG. 3 is a cross-sectional view illustrating a folding area and a portion adjacent thereto of the display apparatus of FIG. 1.
Figure 4:
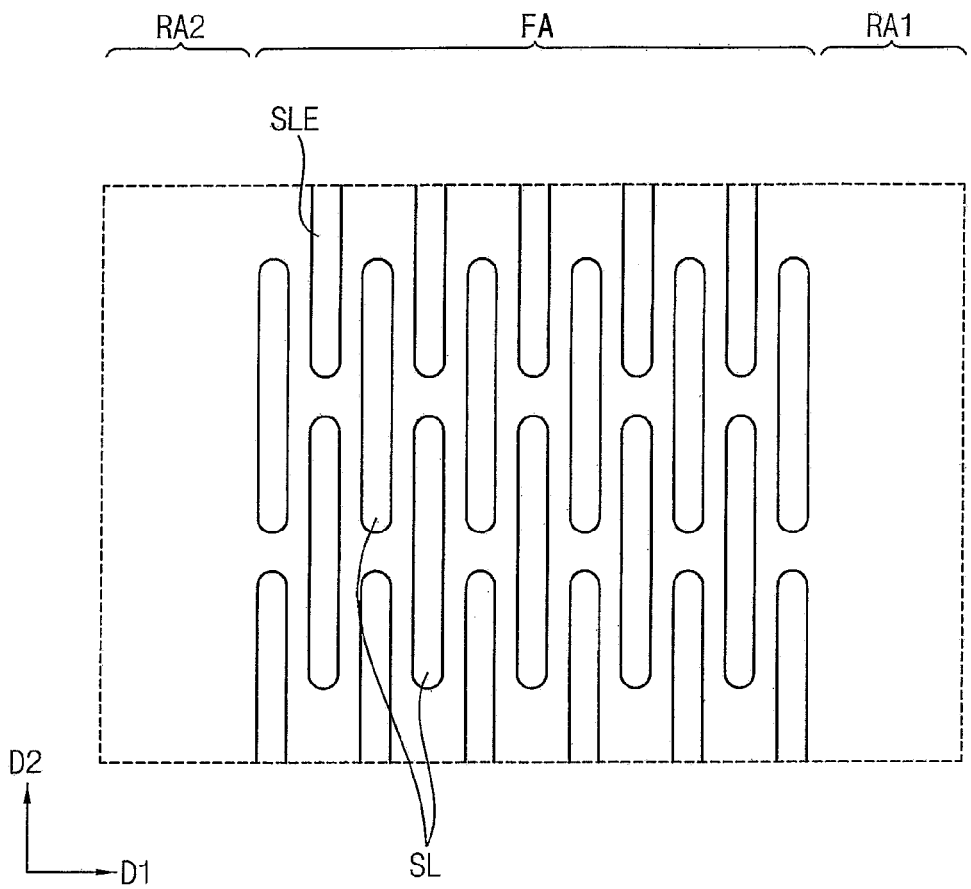
FIG. 4 is a plan view illustrating a folding area and a portion adjacent thereto of a metal plate of FIG. 3.

FIG. 3 is a cross-sectional view illustrating a folding area and a portion adjacent thereto of the display apparatus of FIG. 1, and FIG. 4 is a plan view illustrating a folding area and a portion adjacent thereto of a metal plate of FIG. 3.

Referring to FIGS. 1 to 4, the support structure SPS of the display apparatus may include a metal plate 100, a resin portion 200, a third adhesive layer PSA3, a cushion layer CS, and a second adhesive layer PSA2. The display panel structure PNS of the display apparatus may include a flexible display panel PN, a first adhesive layer PSA1, a window layer CPI, and a protective layer PL.

The metal plate 100 may support the display panel structure PNS. The metal plate 100 may include metal. For example, the metal plate 100 may include steel use stainless (SUS). In another exemplary embodiment, the metal plate 100 may include an alloy (for example, a super-elastic metal), such as nickel-titanium (Ni—Ti), nickel-aluminum (Ni—Al), copper-zinc-nickel (Cu—Zn—Ni), copper-aluminum-nickel (Cu—Al—Ni), copper-aluminum-manganese (Cu—Al—Mn), titanium-nickel-copper-molybdenum (Ti—Ni—Cu—Mo), cobalt-nickel-gallium:iron (Co—Ni—Ga:Fe), silver-nickel (Ag—Ni), gold-cadmium (Au—Cd), iron-platinum (Fe—Pt), iron-nickel (Fe—Ni), and indium-cadmium (In—Cd).

The metal plate 100 may have a first thickness t1 in the first non-folding area RA1 and the second non-folding area RA2, and may have a second thickness t2 less than the first thickness t1 in the folding area FA, as a recess (e.g., a dented portion) is formed in the folding area FA. When the metal plate 100 includes SUS, the first thickness t1 may be about 150 μm and the second thickness t2 may be about 50 μm, without being limited thereto. In some exemplary embodiments, the first thickness t1 may be about 100 μm or less.

The recess may be formed on a side opposite to a surface of the metal plate 100 that contacts the second adhesive layer PSA3. The recess may be substantially filled with the resin portion 200.

Referring to FIG. 4, opening patterns SL may be formed in the folding area FA of the metal plate 100. Each of the opening patterns SL may extend in the second direction D2. The opening patterns SL may be alternately arranged in the first direction D1, and may extend in the second direction D2.

In addition, an edge opening pattern SLE may be disposed at an edge of the metal plate 100 in the second direction D2, which may have one side connected to the edge of the metal plate 100, thereby having an opened shape when viewed in a plan view.

Although the shape of each of the opening patterns SL has been illustrated and described as having substantially a rectangular shape with rounded corners when viewed in a plane view, the inventive concepts are not limited to one particular shape of the opening patterns SL. For example, in some exemplary embodiments, each of the openings may have substantially a rectangular planar shape, a triangular planar shape, a rhombic planar shape, a polygonal planar shape, a circular planar shape, a track-type planar shape, or an oval planar shape.

The resin portion 200 may be disposed in the recess of the metal plate 100. The resin portion 200 may include a base 210 and protrusions 220 protruding from the base 210 and disposed inside the opening patterns SL. The protrusions 220 may be disposed between the base 210 and the display panel structure PNS.

The resin portion 200 may include a low modulus material having a modulus lower than a modulus of the metal plate 100. The resin portion 200 may include elastomer having a relatively large elastic force or relatively large restoring force. For example, the resin portion 200 may include an elastic material, such as silicone, urethane, and thermoplastic polyurethane (TPU). In another exemplary embodiment, the resin portion 200 may include polyethylene terephthalate (PET), polyethylene naphthalene (PEN), polypropylene (PP), polycarbonate (PC), polystyrene (PS), polysulfone (PSul), polyethylene (PE), polyphthalamide (PPA), polyethersulfone (PES), polyarylate (PAR), polycarbonate oxide (PCO), modified polyphenylene oxide (MPPO), and the like.

The resin portion 200 may prevent damages from repeated folding and unfolding by supporting a part of the folding area FA of the metal plate 100 that is relatively thin. In addition, while the display apparatus repeatedly performs folding and unfolding, the resin portion 200 may prevent foreign matters from permeating into the opening patterns SL. Furthermore, while the display apparatus repeatedly performs folding and unfolding, the resin portion 200 may be stretched and shrunk to prevent the opening patterns SL from being exposed.

The resin portion 200 may include a carbon component having excellent thermal conductivity, so that the excellent thermal conductivity properties may be provided. The carbon component may include graphene, carbon nanotubes, graphite, and the like. For example, the resin portion 200 may include graphite powder.

The third adhesive layer PSA3 may be disposed on the metal plate 100. The third adhesive layer PSA3 may be bonded to parts of the metal plate 100 and the resin portion 200. The third adhesive layer PSA3 may include an optical clear adhesive (OCA), a pressure sensitive adhesive (PSA), photo-curable resin or thermosetting resin, and the like. For example, the adhesive may include PET, PEN, PP, PC, PS, PSul, PE, PPA, PES, PAR, PCO, MPPO, and the like, and the resin may include epoxy resin, amino resin, phenol resin, urea resin, melamine resin, unsaturated polyester resin, polyurethane resin, polyimide resin, and the like.

The cushion layer CS may be disposed on the third adhesive layer PSA3. The cushion layer CS may include a material having ductility, so that the display panel structure PNS may be easily folded. For example, the cushion layer CS may include a foam-type material, such as a polyurethane foam and a polystyrene foam.

The second adhesive layer PSA2 may be disposed on the cushion layer CS. The display panel structure PNS may be bonded to the second adhesive layer PSA2. The second adhesive layer PSA2 may include an optical clear adhesive (OCA), a pressure sensitive adhesive (PSA), photo-curable resin or thermosetting resin, and the like. For example, the adhesive may include PET, PEN, PP, PC, PS, PSul, PE, PPA, PES, PAR, PCO, MPPO, and the like, and the resin may include epoxy resin, amino resin, phenol resin, urea resin, melamine resin, unsaturated polyester resin, polyurethane resin, polyimide resin, and the like.

When the folding area FA of the metal plate 100 formed of a metal material is repeatedly folded and unfolded, a temperature at the portion formed with the opening patterns SL in the folding area FA of the metal plate 100 may be increased, which may increase stress to thereby generate cracks. According to the illustrated exemplary embodiment, the metal plate 100 is formed of metal, so that heat in the display panel structure PNS may be efficiently discharged. In addition, the folding area FA of the metal plate 100 may be thinner than other portions and may be formed with the opening patterns SL, so that the bendability may be improved. Further, the resin portion 200 may be formed of a resin material including carbon components having excellent thermal conductivity properties and low modulus, so that heat may be dissipated, the flatness on an outer surface may be improved, and the vibration noise during folding the display apparatus may be reduced in the folding area FA.

The flexible display panel PN may be disposed on the second adhesive layer PSA2. The flexible display panel PN may be a flexible organic light emitting display panel, which will be described in more detail later with reference to FIG. 5.

The first adhesive layer PSA1 may be disposed on the flexible display panel PN. The first adhesive layer PSA1 may include an optical clear adhesive (OCA), a pressure sensitive adhesive (PSA), photo-curable resin or thermosetting resin, and the like. For example, the adhesive may include PET, PEN, PP, PC, PS, PSul, PE, PPA, PES, PAR, PCO, MPPO, and the like, and the resin may include epoxy resin, amino resin, phenol resin, urea resin, melamine resin, unsaturated polyester resin, polyurethane resin, polyimide resin, and the like.

The window layer CPI may be disposed on the first adhesive layer PSA1. The window layer CPI may be a transparent flexible film, such as ultra-thin glass or transparent polyimide.

The protective layer PL may be disposed on the window layer CPI and protect the window layer CPI. The protective layer PL may be bonded to the window layer CPI by an adhesive layer to facilitate replacement of the protective layer PL as needed.

Figure 5:
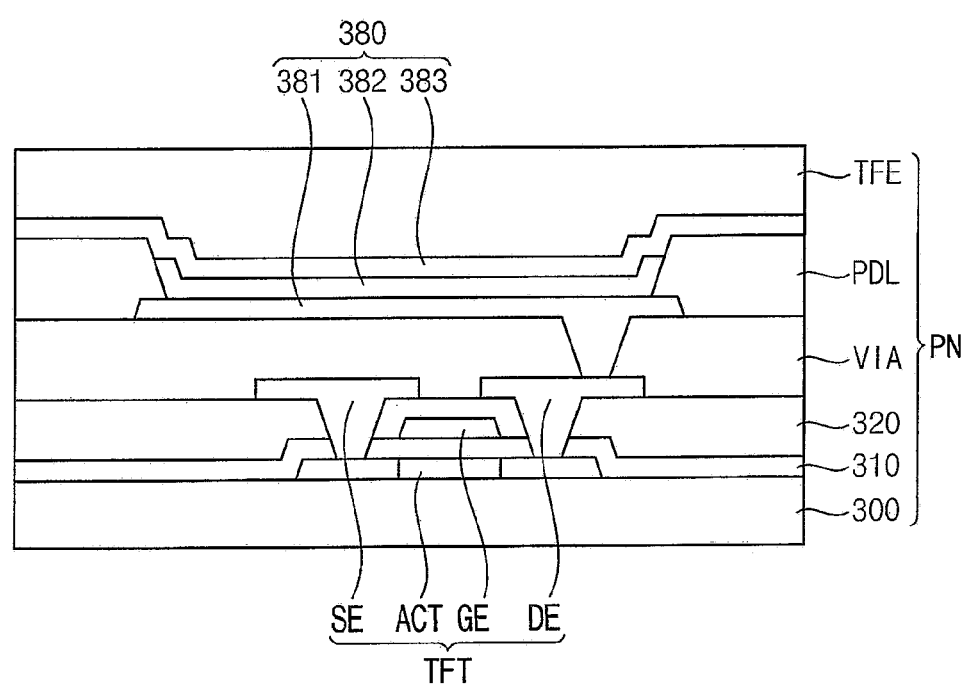
FIG. 5 is a cross-sectional view illustrating a part of a display panel of a display panel structure of the display apparatus of FIG. 3.

FIG. 5 is a cross-sectional view illustrating a part of a display panel of a display panel structure of the display apparatus of FIG. 3.

Referring to FIGS. 3 and 5, the display panel PN may include a flexible substrate 300, a thin film transistor TFT, a first insulating layer 310, a second insulating layer 320, a via insulating layer VIA, a pixel defining layer PDL, a light emitting structure 380, a thin film encapsulation Layer TFE, and the like. The thin film transistor TFT may include an active pattern ACT, a gate electrode GE, a source electrode SE, and a drain electrode DE. The light emitting structure 380 may include a first electrode 381, a light emitting layer 382, and a second electrode 383.

The flexible substrate 300 may include a transparent or opaque material. The flexible substrate 300 may be disposed on the second adhesive layer PSA2. The flexible substrate 300 may be formed of a transparent resin substrate, such as a polyimide substrate. In this case, the polyimide substrate may include a first polyimide layer, a barrier film layer, a second polyimide layer, and the like. In some exemplary embodiments, the flexible substrate 300 may include a quartz substrate, a synthetic quartz substrate, a calcium fluoride substrate, a fluorine-doped (F-doped) quartz substrate, a soda-lime glass substrate, a non-alkali glass substrate, and the like.

A buffer layer may be disposed on the flexible substrate 300. The buffer layer may prevent metal atoms or impurities from diffusing into the thin film transistor TFT from the flexible substrate 300. The buffer layer may also allow the active pattern ACT to have a substantial uniformity by adjusting the heat transfer rate during crystallization process for forming the active pattern ACT. In addition, when a surface of the flexible substrate 300 is not uniform, the buffer layer may improve the flatness of the surface of the flexible substrate 300. Depending on a type of flexible substrate 300, two or more buffer layers may be provided on the flexible substrate 300 or the buffer layer may be omitted. For example, the buffer layer may include an organic material or an inorganic material.

The active pattern ACT may be disposed on the flexible substrate 300. The active pattern ACT may include a metal oxide semiconductor, an inorganic semiconductor, such as amorphous silicon and poly silicon, an organic semiconductor, and the like. The active pattern ACT may have a source area, a drain area, and a channel area between the source area and the drain area.

The first insulating layer 310 may be disposed on the active pattern ACT. For example, the first insulating layer 310 may sufficiently cover the active pattern ACT on the flexible substrate 300, and may have a substantially planar upper surface without generating a step around the active pattern ACT. In some exemplary embodiments, the first insulating layer 310 may be disposed to have a uniform thickness along the profile of the active pattern ACT while covering the active pattern ACT on the flexible substrate 300. The first insulating layer 310 may include a silicon compound, metal oxide, and the like. For example, the first insulating layer 310 may include silicon oxide ($SiO_x$), silicon nitride ($SiN_x$), silicon oxynitride ($SiO_xN_y$), silicon oxycarbide ($SiO_xC_y$), silicon carbonitride ($SiC_xN_y$), aluminum oxide ($AlO_x$), aluminum nitride ($AlN_x$), tantalum oxide ($TaO_x$), hafnium oxide ($HfO_x$), zirconium oxide ($ZrO_x$), titanium oxide ($TiO_x$), and the like. In some exemplary embodiments, the first insulating layer 310 may have a multi-layer structure including a plurality of insulating layers. For example, the insulating layers may have mutually different thicknesses or include mutually different materials.

A gate pattern including a gate electrode GE may be disposed on the first insulating layer 310. The gate pattern may be disposed to overlap the channel area of the active pattern ACT. The gate electrode GE may include metal, an alloy, a metal nitride, a conductive metal oxide, a transparent conductive material, and the like. For example, the gate electrode GE may include gold (Au), silver (Ag), aluminum (Al), tungsten (W), copper (Cu), platinum (Pt), nickel (Ni), titanium (Ti), palladium (Pd), magnesium (Mg), calcium (Ca), lithium (Li), chromium (Cr), tantalum (Ta), molybdenum (Mo), scandium (Sc), neodymium (Nd), iridium (Ir), an alloy containing aluminum, aluminum nitride ($AlN_x$), an alloy containing silver, tungsten nitride ($WN_x$) an alloy containing copper, an alloy containing molybdenum, titanium nitride ($TiN_x$), chromium nitride ($CrN_x$), tantalum nitride ($TaN_x$), strontium ruthenium oxide ($SrRu_xO_y$), zinc oxide ($ZnO_x$), indium tin oxide (ITO), tin oxide ($SnO_x$), indium oxide ($InO_x$), gallium oxide ($GaO_x$), indium zinc oxide (IZO), and the like. These may be used individually or in combination. In some exemplary embodiments, the gate pattern may include a multi-layer structure including a plurality of metal layers. For example, the metal layers may have mutually different thicknesses or include mutually different materials.

The second insulating layer 320 may be disposed on the gate pattern. For example, the second insulating layer 320 may sufficiently cover the gate pattern on the first insulating layer 310, and may have a substantially planar upper surface without generating a step around the gate pattern. In some exemplary embodiments, the second insulating layer 320 may be disposed to have a uniform thickness along a profile of the gate pattern while covering the gate pattern on the first insulating layer 310. The second insulating layer 320 may include a silicon compound, metal oxide, and the like. In some exemplary embodiments, the second insulating layer 320 may have a multi-layer structure including a plurality of insulating layers. For example, the insulating layers may have mutually different thicknesses or include mutually different materials.

A data pattern including a source electrode SE and a drain electrode DE of the thin film transistor TFT may be disposed on the second insulating layer 320. The source electrode SE may be connected to the source area of the active pattern ACT through a contact hole formed by removing first portions of the first insulating layer 310 and the second insulating layer 320, and the drain electrode DE may be connected to the drain area of the active pattern ACT through a contact hole formed by removing second portions of the first insulating layer 310 and the second insulating layer 320. The data pattern may include metal, an alloy, a metal nitride, a conductive metal oxide, a transparent conductive material, and the like. These may be used individually or in combination. In some exemplary embodiments, the data pattern may have a multi-layer structure including a plurality of metal layers. For example, the metal layers may have mutually different thicknesses or include mutually different materials.

Accordingly, the thin film transistor TFT, which includes the active pattern ACT, the first insulating layer 310, the gate electrode 170, the second insulating layer 320, the source electrode SE, and the drain electrode DE, may be formed.

Although the thin film transistor TFT has been shown and described as having a top gate structure, the inventive concepts are not limited thereto. For example, in some exemplary embodiments, the thin film transistor TFT may have a bottom gate structure, a double gate structure, or the like.

The via-insulating layer VIA may be disposed on the second insulating layer 320 and the data pattern. For example, the via-insulating layer VIA may be disposed to have a relatively thick thickness. In this case, the via-insulating layer VIA may have a substantially planar upper surface. In order to from the planar upper surface of the via-insulating layer VIA, a planarization process may be performed on the via-insulating layer VIA. In some exemplary embodiments, the via-insulating layer VIA may be disposed to have a uniform thickness along a profile of the data pattern on the second insulating layer 320. The via-insulating layer VIA may be formed of an organic material or an inorganic material. In some exemplary embodiments, the via-insulating layer VIA may include an organic material. For example, the via-insulating layer VIA may include photoresist, polyacryl-based resin, polyimide-based resin, polyamide-based resin, siloxane-based resin, acryl-based resin, epoxy-based resin, and the like.

The first electrode 381 may be disposed on the via-insulating layer VIA. The first electrode 381 may be electrically connected to the thin film transistor TFT through a contact hole formed by removing a part of the via-insulating layer VIA. The first electrode 381 may include metal, an alloy, a metal nitride, a conductive metal oxide, a transparent conductive material, and the like. These may be used individually or in combination. In some exemplary embodiments, the first electrode 381 may have a multi-layer structure including a plurality of metal layers. For example, the metal layers may have mutually different thicknesses or include mutually different materials.

The pixel defining layer PDL may be disposed on the via-insulating layer VIA. For example, the pixel defining layer PDL may expose a part of the upper surface of the first electrode 381 while covering both side portions of the first electrode 381. The pixel defining layer PDL may be formed of an organic material or an inorganic material. In some exemplary embodiments, the pixel defining layer PDL may include an organic material.

The light emitting layer 382 may be disposed on the pixel defining layer PDL and the first electrode 381. The light emitting layer 382 may include at least one of light emitting materials capable of emitting color lights, such as red light, green light, and blue light, that are different according to sub-pixels. In some exemplary embodiments, the light emitting layer 382 may be formed by laminating a plurality of light emitting materials capable of generating different color light, such as red light, green light, and blue light, such that white light may be emitted as a whole. In this case, a color filter may be disposed on the light emitting layer 382 disposed on the first electrode 381. The color filter may include at least one of a red color filter, a green color filter, and a blue color filter. In some exemplary embodiments, the color filter may include a yellow color filter, a cyan color filter, and a magenta color filter. The color filter may include photosensitive resin or color photoresist.

The second electrode 383 may be disposed on the light emitting layer 382 and the pixel defining layer PDL. The second electrode 383 may include metal, an alloy, a metal nitride, a conductive metal oxide, a transparent conductive material, and the like. These may be used individually or in combination. In some exemplary embodiments, the second electrode 383 may have a multi-layer structure including a plurality of layers. For example, the metal layers may have mutually different thicknesses or include mutually different materials.

The thin film encapsulation layer TFE may be disposed on the second electrode 383. The thin film encapsulation layer TFE may include at least one inorganic layer and organic layer that are alternately laminated. For example, the thin film encapsulation layer TFE may include a first inorganic layer, an organic layer on the first inorganic layer, and a second inorganic layer disposed on the organic layer. The thin film encapsulation layer TFE may prevent the light emitting layer 382 from being deteriorated due to permeation of the moisture, oxygen, or the like. In addition, the thin film encapsulation layer TFE may also protect the display panel PN from an external impact. In addition, the thin film encapsulation layer TFE may improve the flatness of the display panel PN.

In the illustrated exemplary embodiment, although the display apparatus has been described as including an organic light emitting display panel, the inventive concepts are not limited thereto. In some exemplary embodiments, the display apparatus may include a liquid crystal display apparatus (LCD), a field emission display (FED), a plasma display panel (PDP), or an electrophoretic display apparatus (EPD).

Figure 6:
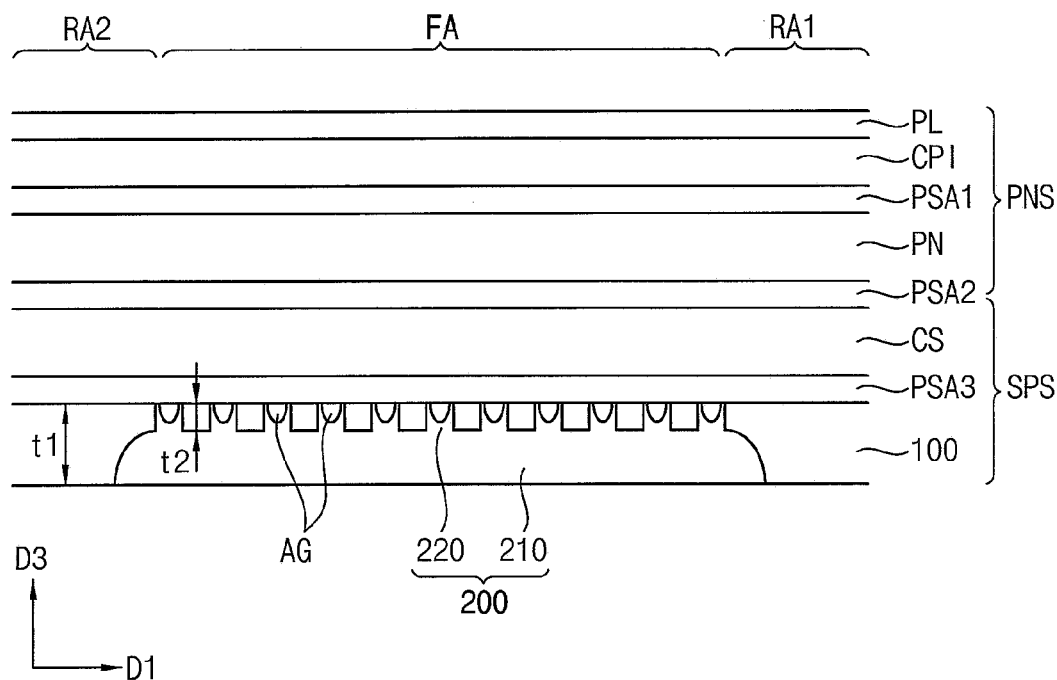
FIG. 6 is a cross-sectional view illustrating a folding area and a portion adjacent thereto of a display apparatus according to another exemplary embodiment.

FIG. 6 is a cross-sectional diagram illustrating a folding area and a portion adjacent thereto of a display apparatus according to another exemplary embodiment.

Referring to FIG. 6, the display apparatus is substantially the same as the display apparatus of FIG. 3, except that an air gap AG is formed in the opening pattern of the metal plate 100. Accordingly, repeated descriptions of the substantially the same elements of the display apparatus already described above will be omitted.

The display apparatus according to the illustrated exemplary embodiment may include a display panel structure PNS including a flexible display panel, and a support structure SPS configured to support the display panel structure PNS.

The support structure SPS of the display apparatus may include a metal plate 100, a resin portion 200, a third adhesive layer PSA3, a cushion layer CS, and a second adhesive layer PSA2. The display panel structure PNS of the display apparatus may include a flexible display panel PN, a first adhesive layer PSA1, a window layer CPI, and a protective layer PL.

An air gap AG may be formed in the opening pattern of the metal plate 100. The air gap AG may be defined by an upper surface of the protrusion 220 of the resin portion 200 and a lower surface of the third adhesive layer PSA3.

When the folding area FA of the display apparatus is bent, a part of the resin portion 200 may be pushed up or down with respect to the opening pattern of the metal plate 100. In this case, a pressure may be applied in a direction of flexible display panel PN or in an opposite direction, which may form a concavo-convex portion on the display surface. In the display apparatus according to the illustrated exemplary embodiment, however, since the air gap AG is formed in the opening pattern of the metal plate 100, the generation of a concavo-convex portion on the display surface may be prevented or at least be suppressed when the folding area FA of the display apparatus is bent.

Accordingly, the quality of the display surface of the display apparatus may be improved, and the wrinkles and the like in the folding area FA may be prevented or at least be suppressed.

In addition, since the air gap AG is formed without filling the opening pattern of the metal plate 100 with the protrusions 220 of the resin portion 200, an adhesive strength between the upper surface of the metal plate 100 and the third adhesive layer PSA3 in the folding area FA may be increased due to the air gap AG.

FIGS. 7A to 7E are cross-sectional view illustrating a method of manufacturing the display apparatus of FIG. 3.

Figure 7A:
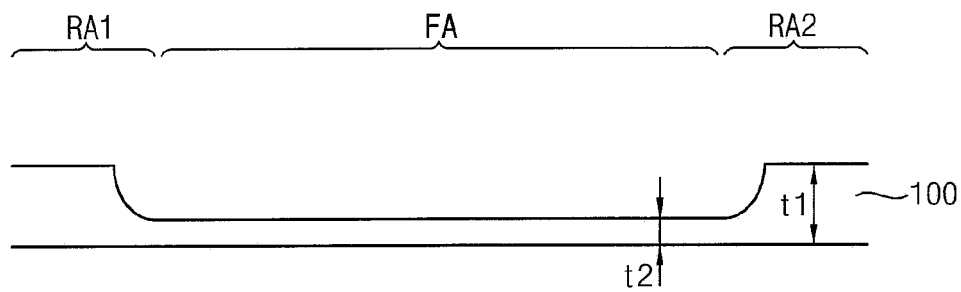
FIGS. 7A, 7B, 7C, 7D, and 7E are cross-sectional views illustrating a method of manufacturing the display apparatus of FIG. 3.

Referring to FIG. 7A, a primary etching process may be performed on the metal plate 100 to remove a portion of the metal plate 100 that corresponds to the folding area FA. For example, a photoresist layer may be formed on the metal plate 100, and the photoresist layer may be exposed and developed, so that a photoresist pattern covering the first non-folding area RA1 and the second non-folding area RA2 may be formed. Then, the metal plate 100 may be etched by using the photoresist pattern as an etching barrier, so that the metal plate 100 may be formed to have a first thickness t1 in the first non-folding area RA1 and the second non-folding area RA2, and have a second thickness t2 less than the first thickness t1 in the folding area FA.

Figure 7B:
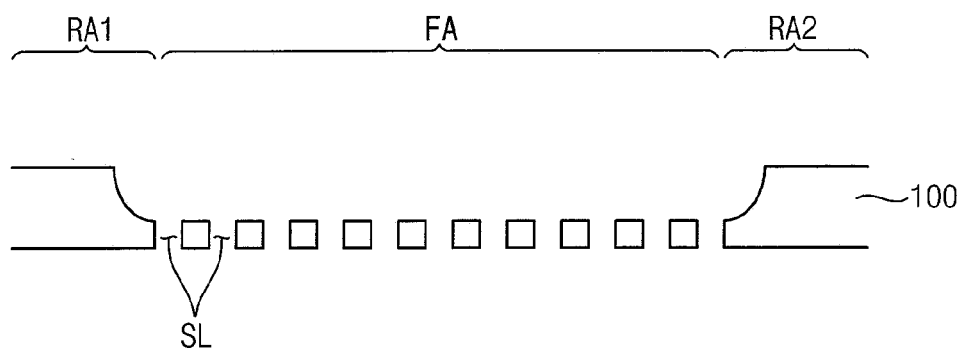

Referring to FIG. 7B, an opening pattern SL may be formed in the folding area FA of the metal plate 100 by a secondary etching process. For example, a photoresist layer may be formed on the metal plate 100, and the photoresist layer may be exposed and developed, so that a photoresist pattern may cover parts of the first non-folding area RA1, the second non-folding area RA2, and the folding area FA. Then, the metal plate 100 may be etched by using the photoresist pattern as an etch barrier so that the opening pattern SL may be formed.

Although the primary etching process and the secondary etching process have been described as being performed through separate processes, in some exemplary embodiments, the portion having the first thickness t1 and the opening pattern SL may be formed through one etching process using a halftone mask or the like.

Figure 7C:
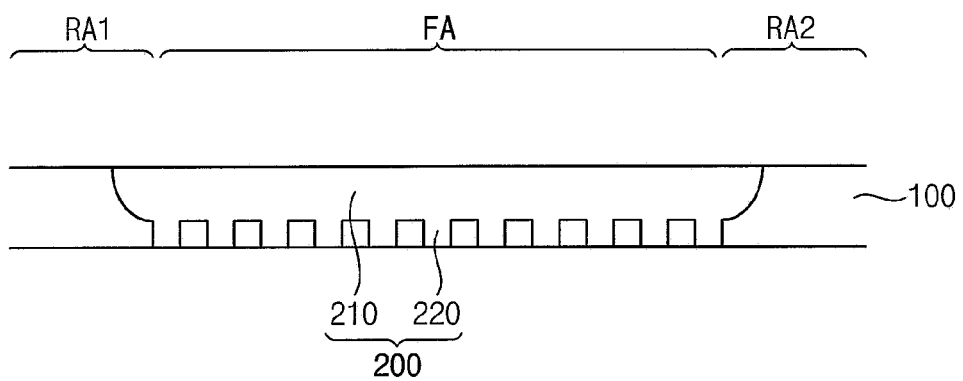

Referring to FIG. 7C, the resin portion 200 may be formed on the metal plate 100. The resin portion 200 may be formed in the recess, which is a portion removed through the primary and secondary etching processes, of the folding area FA of the metal plate 100. For example, a resin solution may be injected and cured to form the resin portion 200 including the base 210 and the protrusion 220 that are disposed in the opening pattern SL of the metal plate 100.

Figure 7D:
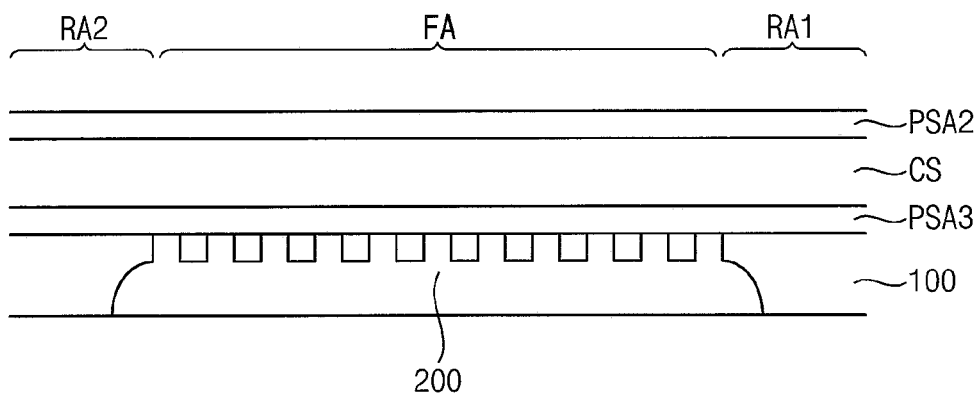

Referring to FIG. 7D, a third adhesive layer PSA3, a cushion layer CS, and a second adhesive layer PSA2 may be formed on the metal plate 100. For example, after the third adhesive layer PSA3 and the second adhesive layer PSA2 are attached onto both sides of the cushion layer CS, respectively, the third adhesive layer PSA3 is attached onto a surface of the metal plate 100 that opposes the base 210 of the resin portion 200. In this manner, the support structure SPS may be formed.

Figure 7E:
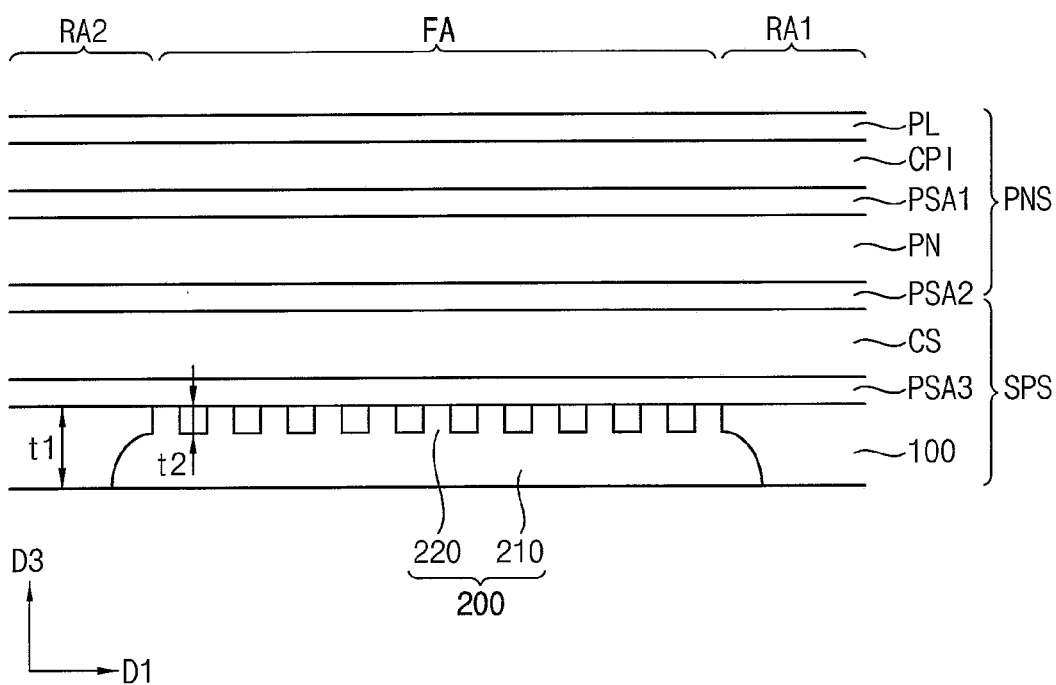

Referring to FIG. 7E, the display panel structure PNS may be attached onto the second adhesive layer PSA2 of the support structure SPS, so that the display apparatus may be manufactured.

The display panel structure PNS may include a display panel PN, a first adhesive layer PSA1 disposed on the display panel PN, a window layer CPI disposed on the first adhesive layer PSA1, and a protective layer PL disposed on the window layer CPI. For example, the display panel structure PNS may be formed by attaching the window layer CPI and the protective layer PL onto the display panel PN, which may be a flexible organic light emitting display panel, by using the first adhesive layer PSA1.

FIGS. 8A to 8D are cross-sectional views illustrating a method of manufacturing the display apparatus of FIG. 6. The manufacturing method according to the illustrated exemplary embodiment is substantially the same as the method described above with reference to FIGS. 7A to 7E, except for forming an air gap AG. As such, repeated descriptions of substantially the same steps described above will be omitted.

Figure 8A:
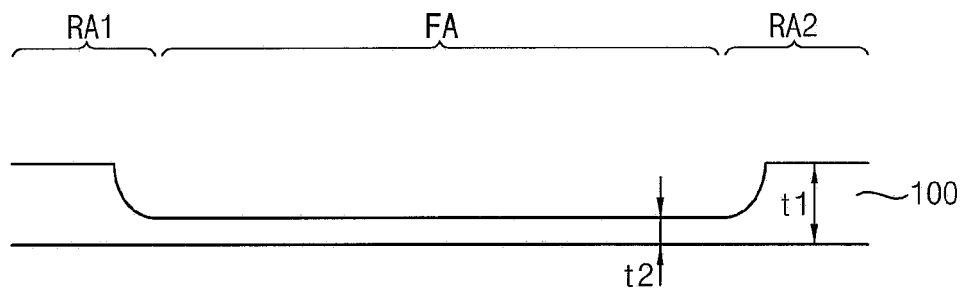
FIGS. 8A, 8B, 8C, 8D, and 8E are cross-sectional views illustrating a method of manufacturing the display apparatus of FIG. 6.

Referring to FIG. 8A, a portion corresponding to the folding area FA of the metal plate 100 may be partially removed, so that the metal plate 100 may be formed to have a first thickness t1 in the first non-folding area RA1 and the second non-folding area RA2, and have a second thickness t2 less than the first thickness t1 in the folding area FA.

Figure 8B:
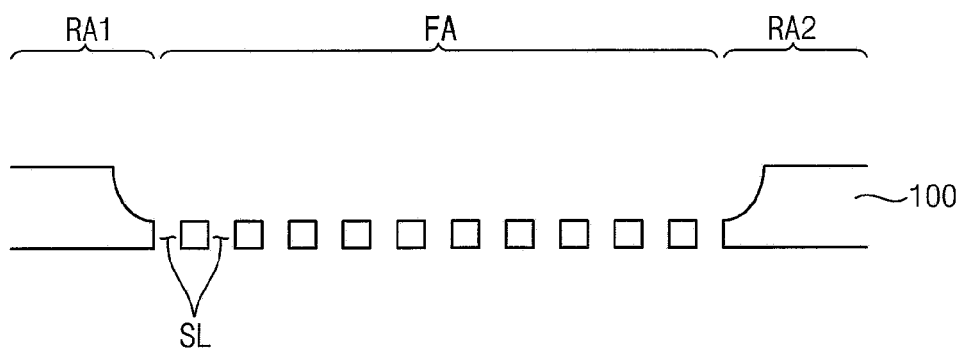

Referring to FIG. 8B, an opening pattern SL may be formed in the folding area FA of the metal plate 100.

Figure 8C:
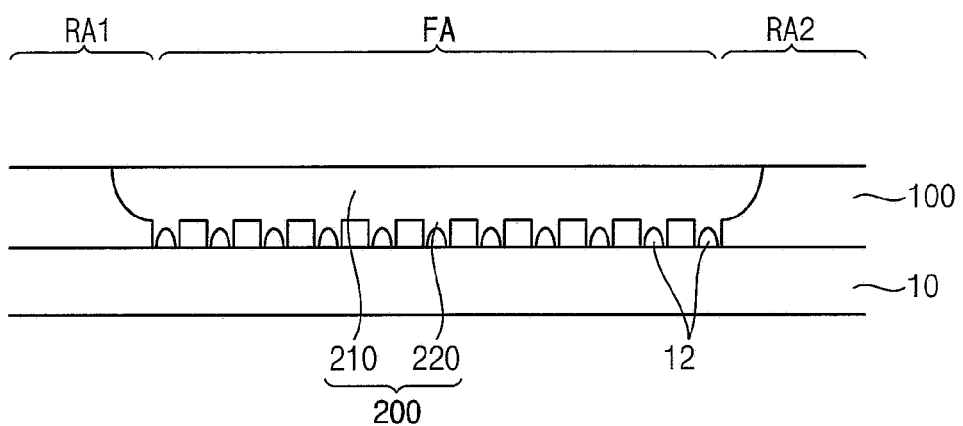

Referring to FIG. 8C, the resin portion 200 may be formed on the metal plate 100. A support portion 10 may be disposed below the metal plate 100, and projections 12 may be formed in the support portion 10 to correspond to the opening pattern SL of the metal plate. In this case, the resin solution for forming the resin portion 200 may not be filled in the projections 12. Accordingly, an end of each protrusion 220 of the resin portion 200 may have a dented shape. The dented shape may provide a space for forming an air gap AG to be described later.

Figure 8D:
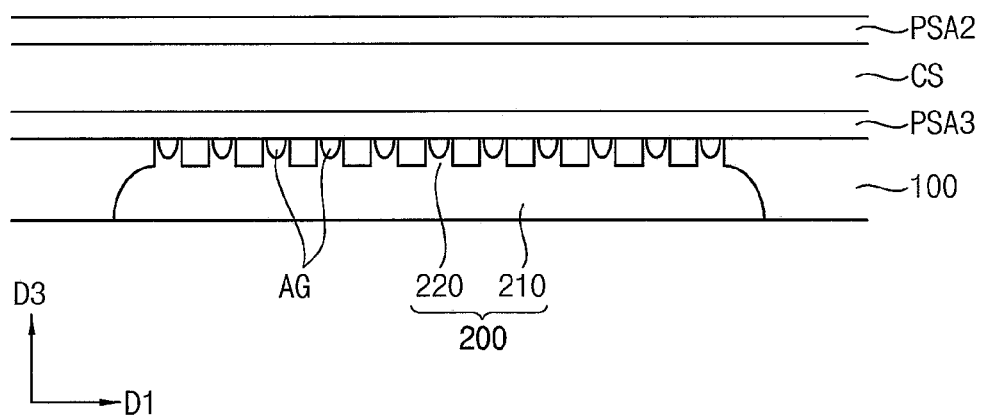

Referring to FIG. 8D, the support portion 10 may be removed from the metal plate 100, and a third adhesive layer PSA3, a cushion layer CS, and a second adhesive layer PSA2 may be formed on the metal plate 100. For example, after the third adhesive layer PSA3 and the second adhesive layer PSA2 are attached onto both sides of the cushion layer CS, respectively, the third adhesive layer PSA3 is attached onto a surface of the metal plate 100 that opposes the base 210 of the resin portion 200. In this manner, the support structure SPS may be formed.

Since the dented shape is formed at the end of the protrusion 220 of the resin portion 200, the air gap AG may be formed between the lower surface of the third adhesive layer PSA3 and the upper surface of the protrusion 220.

Figure 8E:
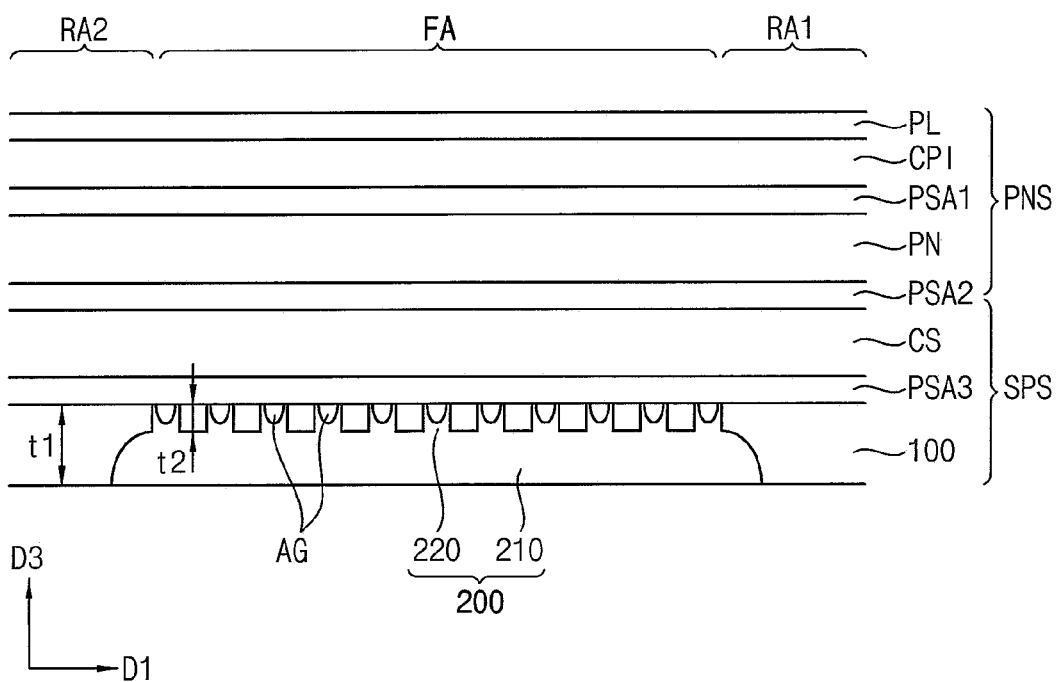

Referring to FIG. 8E, the display panel structure PNS may be attached onto the second adhesive layer PSA2 of the support structure SPS, so that the display apparatus may be manufactured.

The display panel structure PNS may include a display panel PN, a first adhesive layer PSA1 disposed on the display panel PN, a window layer CPI disposed on the first adhesive layer PSA1, and a protective layer PL disposed on the window layer CPI.

Figure 9:
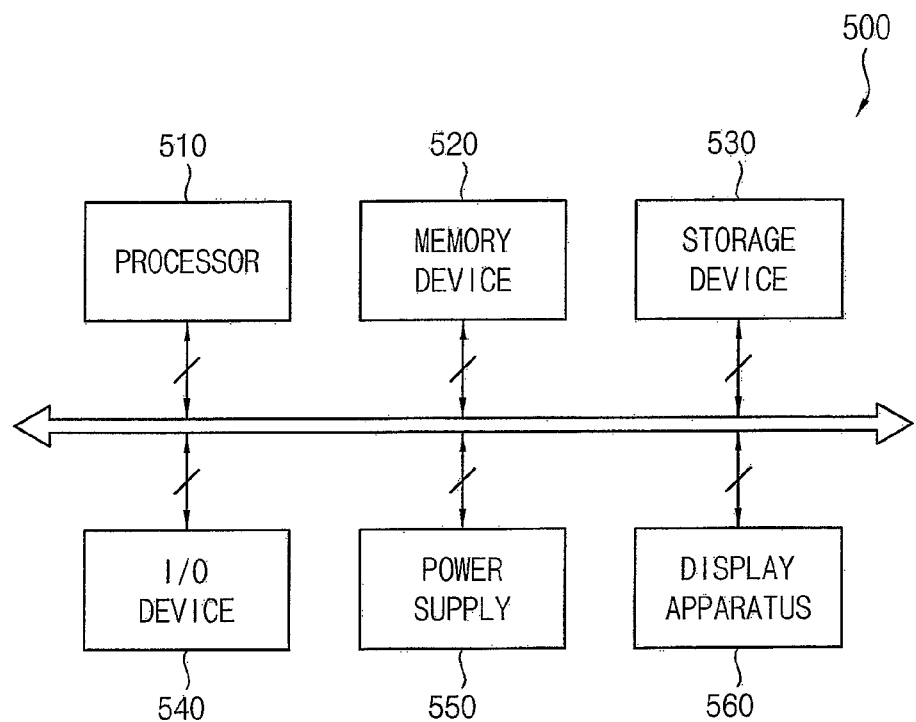
FIG. 9 is a block diagram illustrating an electronic apparatus according to an exemplary embodiment.
Figure 10:
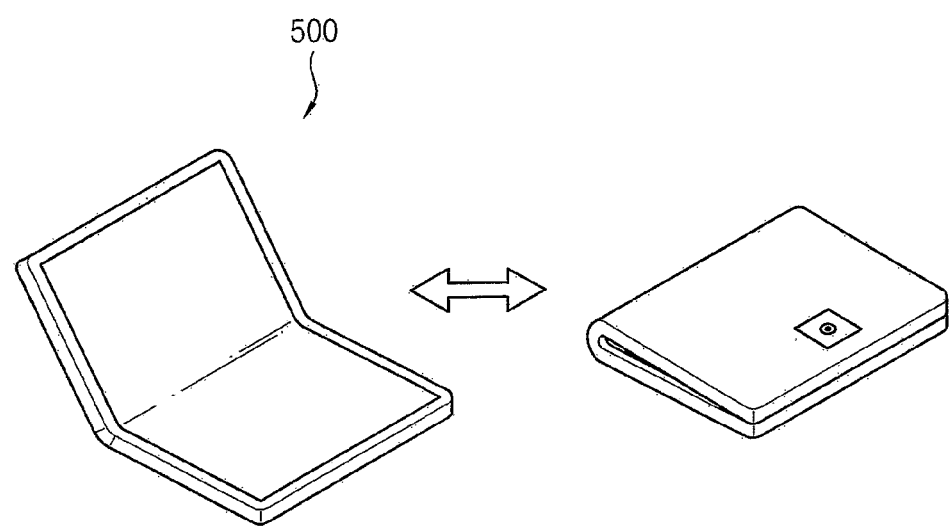
FIG. 10 is a perspective view exemplarily illustrating the electronic apparatus of FIG. 9 implemented as a smart phone.

FIG. 9 is a block diagram illustrating an electronic apparatus according to an exemplary embodiment, and FIG. 10 is a perspective view of exemplarily illustrating an electronic apparatus of FIG. 9 implemented as a smart phone.

Referring to FIGS. 9 and 10, the electronic apparatus 500 may include a processor 510, a memory device 520, a storage device 530, an input/output (I/O) device 540, a power supply 550, and a display apparatus 560. The display apparatus 560 may include the display apparatus of FIG. 1. In addition, the electronic apparatus 500 may further include a plurality of ports for communicating with a video card, a sound card, a memory card, a universal serial bus (USB) device, other electronic apparatuses, etc. In an exemplary embodiment, as illustrated in FIG. 10, the electronic apparatus 500 may be implemented as a foldable smart phone. However, the electronic apparatus 500 is not limited thereto. For example, the electronic apparatus 500 may be implemented as a cellular phone, a video phone, a smart pad, a smart watch, a tablet PC, a car navigation system, a computer monitor, a laptop, a head mounted display (HMD) apparatus, etc.

The processor 510 may perform various computing functions. The processor 510 may be a micro processor, a central processing unit (CPU), an application processor (AP), etc. The processor 510 may be coupled to other components via an address bus, a control bus, a data bus, etc. Further, the processor 510 may be coupled to an extended bus, such as a peripheral component interconnection (PCI) bus. The memory device 520 may store data for operations of the electronic apparatus 500. For example, the memory device 520 may include at least one non-volatile memory device, such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc., and/or at least one volatile memory device, such as a dynamic random access memory (DRAM) device, a static random access memory (SRAM) device, a mobile DRAM device, etc. The storage device 530 may include a solid state drive (SSD) device, a hard disk drive (HDD) device, a CD-ROM device, etc. The I/O device 540 may include an input device, such as a keyboard, a keypad, a mouse device, a touch-pad, a touch-screen, etc., and an output device, such as a printer, a speaker, etc. The power supply 550 may provide power for operations of the electronic apparatus 500.

The display apparatus 560 may be coupled to other components via the buses or other communication links. In some exemplary embodiments, the I/O device 540 may include the display apparatus 560. As described above, the display apparatus 560 may include a first non-folding area, a second non-folding area spaced apart from the first non-folding area, and a folding area between the first non-folding area and the second non-folding area. The display apparatus may include a flexible display panel, a metal plate configured to support the flexible display panel and having a first thickness in the first non-folding area and the second non-folding area and a second thickness less than the first thickness in the folding area due to a recess formed in the folding area, a resin portion disposed in the recess, and a first adhesive layer disposed between the flexible display panel and the metal plate. The metal plate may be formed of metal, so that the heat of the flexible display panel may be efficiently discharged (or emitted). In addition, the folding area of the metal plate may be formed thinner than other portions, and opening patterns may be formed in the folding area, so that the bendability may be improved. Further, the resin portion may be formed of a resin material including carbon components having excellent thermal conductivity properties and having a low modulus, so that the heat may be dissipated, the flatness on an outer surface may be improved, and the vibration noise from folding the display apparatus may be reduced, in the folding area.

The exemplary embodiments may be applied to a display apparatus (e.g., an organic light-emitting display apparatus) and an electronic apparatus including the display apparatus. For example, the exemplary embodiments may be applied to a smart phone, a cellular phone, a video phone, a smart pad, a smart watch, a tablet PC, a car navigation system, a television, a computer monitor, a laptop, a head mounted display apparatus, etc.

According to exemplary embodiments, a display apparatus may include a first non-folding area, a second non-folding area spaced apart from the first non-folding area, and a folding area between the first non-folding area and the second non-folding area. The display apparatus may include a flexible display panel, a metal plate configured to support the flexible display panel and having a first thickness in the first non-folding area and the second non-folding area and a second thickness less than the first thickness in the folding area due to a recess formed in the folding area, a resin portion disposed in the recess, and a first adhesive layer disposed between the flexible display panel and the metal plate. The metal plate may be formed of metal, so that heat of the flexible display panel may be efficiently discharged (or emitted). In addition, the folding area of the metal plate may be formed thinner than other portions, and opening patterns may be formed, so that the bendability may be improved. Further, the resin portion may be formed of a resin material including carbon components having excellent thermal conductivity properties and having a low modulus, so that the heat may be dissipated, the flatness on an outer surface may be improved, and the vibration noise due to folding may be reduced, in the folding area.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display apparatus including a first non-folding area, a second non-folding area spaced apart from the first non-folding area, and a folding area between the first non-folding area and the second non-folding area, the display apparatus comprising:
   a flexible display panel having a display area disposed in the first non-folding area, the second non-folding area, and the folding area;
   a metal plate supporting the flexible display panel and including a recess in the folding area, the metal plate having a first thickness in the first non-folding area and the second non-folding area, and a second thickness less than the first thickness in the folding area;
   a resin portion disposed in the recess; and
   a first adhesive layer disposed between the flexible display panel and the metal plate.

2. The display apparatus of claim 1, wherein the metal plate further includes opening patterns in the folding area, and
   wherein the recess overlaps the display area of the flexible display panel in a plan view.

3. The display apparatus of claim 2, wherein the metal plate includes steel use stainless (SUS).

4. The display apparatus of claim 3, wherein the first thickness of the metal plate is about 100 μm or less.

5. The display apparatus of claim 2, wherein:
the resin portion includes a base and protrusions protruding from the base and disposed inside the opening patterns; and the protrusions are disposed between the base and the flexible display panel.

6. The display apparatus of claim 5, wherein the resin portion includes a carbon component.

7. The display apparatus of claim 6, wherein the resin portion includes graphite powder.

8. The display apparatus of claim 5, wherein the resin portion has a modulus lower than a modulus of the metal plate.

9. The display apparatus of claim 5, wherein an air gap is formed in the opening pattern of the metal plate.

10. The display apparatus of claim 9, wherein the air gap is defined by an upper surface of the protrusion of the resin portion and a lower surface of the first adhesive layer.

11. The display apparatus of claim 2, wherein:
the first and second non-folding areas are spaced apart in a first direction; and
each of the opening patterns of the metal plate extends in a second direction perpendicular to the first direction and is disposed in a zigzag form in the first direction.

12. The display apparatus of claim 11, wherein the opening pattern disposed at an edge of the metal plate in the second direction has one side connected to the edge of the metal plate and is opened, when viewed in a plan view.

13. The display apparatus of claim 1, wherein the flexible display panel is configured to be positioned inward of the metal plate when the display apparatus is in a folded state due to bending of the folding area.

14. The display apparatus of claim 1, further comprising:
a cushion layer disposed between the first adhesive layer and the flexible display panel, the cushion layer including a foam-shaped material; and
a second adhesive layer disposed between the cushion layer and the flexible display panel.

15. The display apparatus of claim 1, wherein the flexible display panel includes:
a flexible substrate;
a thin film transistor disposed on the flexible substrate;
a first electrode electrically connected to the thin film transistor;
a light emitting structure disposed on the first electrode; and
a second electrode disposed on the light emitting structure.

16. The display apparatus of claim 15, further comprising:
a thin film encapsulation layer disposed on the second electrode;
a third adhesive layer disposed on the thin film encapsulation layer; and
a window layer disposed on the third adhesive layer.

17. A method of manufacturing a display apparatus including a first non-folding area, a second non-folding area spaced apart from the first non-folding area, and a folding area between the first non-folding area and the second non-folding area, the method comprising:
forming a recess on a metal plate in the folding area to have a first thickness in the first non-folding area and the second non-folding area, and a second thickness less than the first thickness in the folding area by the recess;
forming a resin portion in the recess of the metal plate;
attaching a cushion layer onto the side of the metal plate opposite to the resin portion by using a first adhesive layer; and
attaching a display panel structure including a flexible display panel onto the cushion layer,
wherein the flexible display panel has a display area disposed in the first non-folding area, the second non-folding area, and the folding area.

18. The method of claim 17, wherein forming the metal plate includes:
forming the recess by removing a portion of the metal plate in the folding area through an etching process; and
forming opening patterns on the metal plate in the folding area through an etching process, and
wherein the recess overlaps the display area of the flexible display panel in a plan view.

19. The method of claim 18, further comprising providing a resin solution in the recess and the opening patterns of the metal plate to form a resin portion including a base and protrusions protruding from the base and disposed inside the opening patterns.

20. The method of claim 19, wherein forming the resin portion includes:
providing a support portion having projections corresponding to the opening patterns under the metal plate before providing the resin solution; and
forming the resin portion including the base and the protrusions by providing the resin solution, and
removing the support portion from the metal plate, and
wherein, when the cushion layer is attached onto the metal plate by using the first adhesive layer, an air gap defined by an upper surface of the protrusion of the resin portion and a lower surface of the first adhesive layer is formed in the opening pattern.

* * * * *